United States Patent
Sugiyama

(10) Patent No.: US 10,349,492 B2
(45) Date of Patent: *Jul. 9, 2019

(54) WAVELENGTH TUNABLE LIGHT SOURCE, LIGHT SOURCE MODULE, AND WAVELENGTH CONTROL METHOD

(71) Applicant: Fujitsu Optical Components Limited, Kawasaki-shi, Kanagawa (JP)

(72) Inventor: Masaki Sugiyama, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/902,227

(22) Filed: Feb. 22, 2018

(65) Prior Publication Data
US 2018/0249555 A1   Aug. 30, 2018

(30) Foreign Application Priority Data
Feb. 24, 2017 (JP) .................................. 2017-033741

(51) Int. Cl.
*H05B 37/02* (2006.01)
*G02B 6/00* (2006.01)
(Continued)

(52) U.S. Cl.
CPC .......... *H05B 37/0227* (2013.01); *G02B 6/00* (2013.01); *H01S 5/00* (2013.01); *H01S 5/0687* (2013.01);
(Continued)

(58) Field of Classification Search
CPC ............ H04J 14/0283; H04J 14/0227; H04J 14/0295; H04J 14/0291; H04J 14/0297;
(Continued)

(56) References Cited

U.S. PATENT DOCUMENTS 10,103,809 B2 * 10/2018 Sugiyama ........ H04B 10/07957
2014/0153934 A1 * 6/2014 Sugiyama ............... G02F 1/035
398/200
(Continued)

FOREIGN PATENT DOCUMENTS

WO   WO 2016/010528 A1   1/2016

*Primary Examiner* — Minh D A
(74) *Attorney, Agent, or Firm* — Staas & Halsey LLP

(57) ABSTRACT

A wavelength tunable light source has a light source, a wavelength monitor circuit that receives a portion of light emitted from the light source, and a processor that controls a wavelength of the light emitted from the light source based upon an output value of the wavelength monitor circuit, wherein the wavelength monitor circuit has a wavelength filter that outputs four light components with optical phases shifted by 90 degrees from one another and multiple photo detectors that detects the four light components output from the wavelength filter, and wherein the processor selects at least one of the four light components, calculates a ratio of a monitor value of the selected light component to a total sum of monitor values of the four light components, and adjusts the wavelength of the light source so as to bring the ratio to be closer to a target ratio at a designated wavelength.

15 Claims, 16 Drawing Sheets

(51) Int. Cl.
*H01S 5/00* (2006.01)
*H01S 5/0687* (2006.01)
*H01S 5/14* (2006.01)
*H01S 5/026* (2006.01)
*H01S 5/06* (2006.01)
*H01S 5/10* (2006.01)
*G01J 3/02* (2006.01)

(52) U.S. Cl.
CPC .............. *H01S 5/142* (2013.01); *G01J 3/0259* (2013.01); *H01S 5/0265* (2013.01); *H01S 5/0612* (2013.01); *H01S 5/1032* (2013.01)

(58) Field of Classification Search
CPC .... H04J 14/02; H04J 14/0221; H04J 14/0212; H04B 10/27; H04B 10/506; H04B 10/572; H04B 10/2503; H04B 10/2581; H01S 5/0687; H01S 5/026; H01S 5/0268; G02B 6/4246; G02B 6/2937; G02B 6/12019
See application file for complete search history.

(56) References Cited

U.S. PATENT DOCUMENTS

2015/0085292 A1* 3/2015 Uesaka ................. G01J 9/0246
356/477
2016/0094297 A1* 3/2016 Xie ...................... H04B 10/616
398/202

* cited by examiner

WAVELENGTH TUNABLE LIGHT SOURCE, LIGHT SOURCE MODULE, AND WAVELENGTH CONTROL METHOD

CROSS-REFERENCE TO RELATED APPLICATIONS

This application is based upon and claims priority to earlier filed Japanese Patent Application No. 2017-033741 filed Feb. 24, 2017, which is incorporated herein by reference in its entirety.

FIELD

The present invention relates to a wavelength tunable light source and a light source module for use in optical communications networks, as well as to a wavelength control method.

BACKGROUND

To achieve high-capacity fiber optic communications, wavelength division multiplexing (WDM) technology is being adopted. In WDM, a tunable light source (TLS) capable of emission at different wavelengths is used. A wavelength monitor circuit is provided in a tunable light source to control the wavelength. In general, a wavelength monitor circuit is implemented by combination of a spectral filter (or a wavelength filter) having a periodic transmission spectrum and a photodiode (PD). A delay interferometer is used as such a wavelength filter. See, for example, U.S. patent application publication No. 2015/0085292 A1 and International Publication No. WO 2016/010528 A1.

FIG. 1 illustrates a configuration of conventional wavelength tunable light source. By having a light beam output from a semiconductor optical amplifier (indicated as "SOA1") bounce between a resonator filter and the SOA1, light with a specific wavelength is amplified selectively. A portion of the amplified light is taken out from tap-1 and branched into two at tap-2. One of the branched light components is input to a wavelength filter, and the other is amplified by and output from another semiconductor optical amplifier (indicated as "SOA2"). A portion of the output light is received by a power monitoring photodiode "PDm". The wavelength filter has a 3 dB coupler, a 90-degree hybrid coupler, and two waveguides extending at different lengths between the 3 dB coupler and the 90-degree hybrid coupler. Two light components output from the 90-degree hybrid coupler, with optical phases offset by 90 degrees from each other, are received at PD1 and PD2, respectively.

Photocurrents detected by the PD1 and the PD2 of the wavelength monitor circuit are denoted as I1 and I2, respectively, and photocurrent detected by the power monitoring photodiode "PDm" is denoted as $I_{mon}$. FIG. 2 illustrates spectra of two current ratios (i.e., transmission spectra of the wavelength filter) as a function of wavelength. The current ratio of I1 to $P_{mon}$ (I1/$I_{mon}$) is indicated by a thin solid line and the current ratio of I2 to $I_{mon}$ (I2/$I_{mon}$) is indicated by a bold line. In order to precisely control the wavelength so as to be consistent with the respective wavelength gridlines, it is preferable for the filtering spectrum to have a greater slope. The greater the slope, the more sensitive the wavelength control with more derivative gain. At each wavelength gridline, whichever of the current ratios I1/$I_{mon}$ and I2/$I_{mon}$ with a greater slope is selected, and the wavelength is controlled by adjusting heater current for the resonator filter so as to bring the current ratio to be the target value.

With the configuration of FIG. 1, the intensity of light received at the power monitor "PDm" varies depending on the state of the semiconductor optical amplifier "SOA2", and the wavelength monitor circuit cannot achieve satisfactory accuracy. Another known structure of wavelength monitor circuit is illustrated in FIG. 3. A portion of light guided to the wavelength monitor circuit is branched at tap-3, and received by an additional photodiode PDmW for wavelength monitoring. The light received at PDmW is used as reference light.

In the configuration of FIG. 3, the additional tap-3 is required and the quantity of light received at PD1 and PD2 is reduced. If the split ratio (or coupling ratio) of tap-2 is adjusted for the purpose of securing an adequate quantity of light for wavelength monitoring, the intensity of light output from the SOA2 will decrease. Besides, the coupling ratio of tap-3 depends on the wavelength. In order to acquire an adequate quantity of light needed for the wavelength monitoring photodiode PDmW, the coupling ratio of tap-3 is determined on the basis of a wavelength that minimizes the branching ratio of light supplied from tap-3 to PDmW. This is because, at a wavelength that maximizes the branching ratio of light supplied from tap-3 to PDmW, the quantity of light received at PD1 and PD2 decreases. To compensate for the reduction in the quantity of received light, the coupling ratio at tap-2 toward the wavelength filter has to be increased. This results in increased optical loss, and the power level of light output from the light source decreases due to the optical loss. Moreover, another problem arises such that the controlled wavelength itself may shift and the wavelength filter becomes unstable, due to the wavelength dependency of the coupling ratio of tap-3.

There is a demand for a wavelength tunable light source using a wavelength monitor with stable operation and less optical loss.

SUMMARY

According to an aspect of the invention, a wavelength tunable light source has a light source, a wavelength monitor circuit configured to receive a portion of light emitted from the light source, and a processor that controls a wavelength of the light emitted from the light source based upon an output value of the wavelength monitor circuit, wherein the wavelength monitor circuit has a wavelength filter that outputs four light components with optical phases shifted by 90 degrees from one another, and multiple photo detectors configured to detect the four light components output from the wavelength filter, and wherein the processor selects at least one of the four light components, calculates a ratio of a monitor value of the at least one selected light component to a total sum of monitor values of the four light components, and adjusts the wavelength of the light source so as to bring the ratio to be closer to a target ratio at a designated wavelength.

The object and advantages of the invention will be realized and attained by means of the elements and combinations particularly pointed out in the claims. It is to be understood that both the foregoing general description and the following detailed description are exemplary and explanatory and are not restrictive to the invention as claimed.

BRIEF DESCRIPTION OF DRAWINGS

FIG. 7 is a cross-sectional view of the SOI substrate of the light source module, in which a Germanium PD is built in;

DESCRIPTION OF EMBODIMENTS

Figure 4:
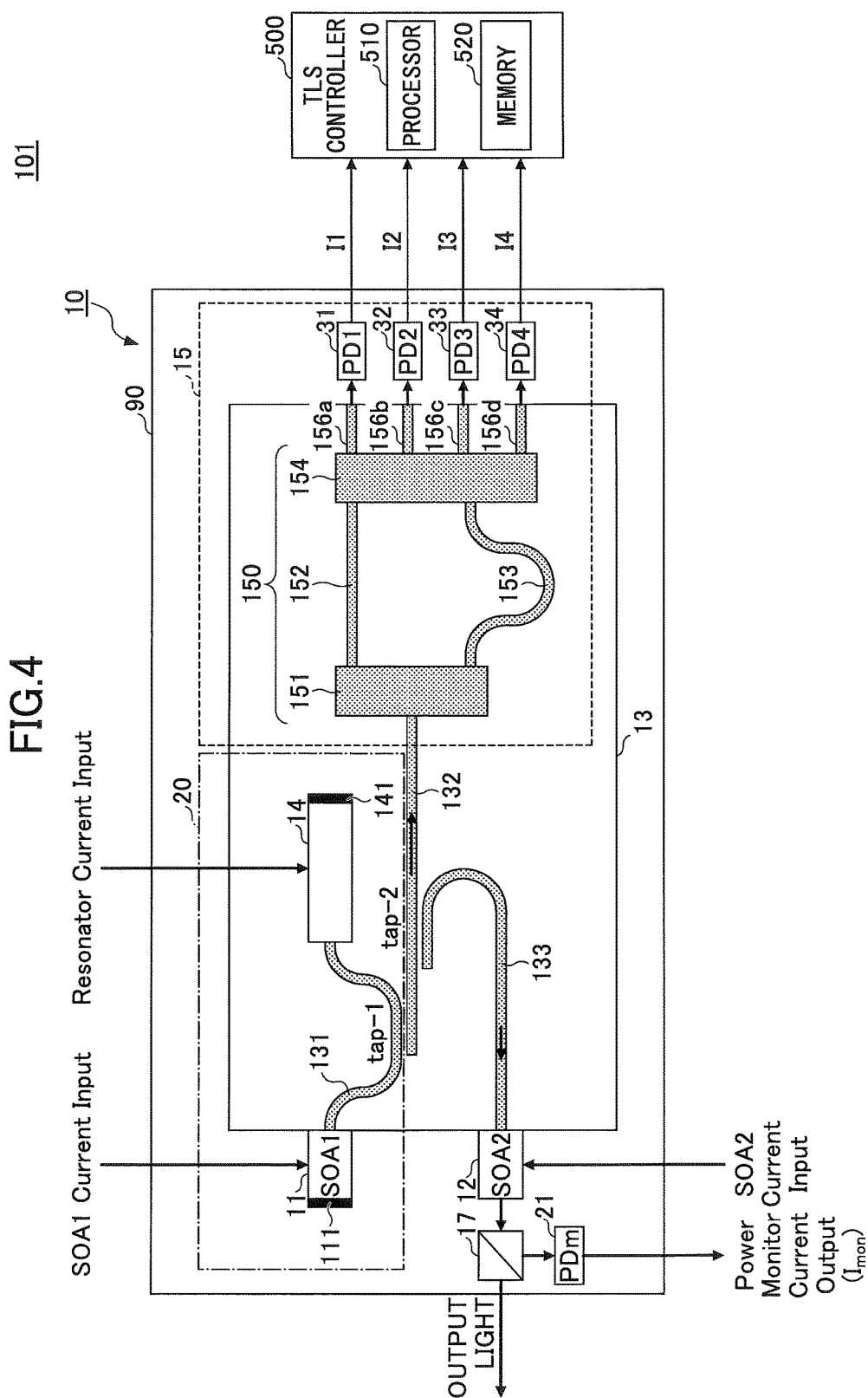
FIG. 4 is a schematic diagram of a wavelength tunable light source with a wavelength monitor circuit according to an embodiment.

FIG. 4 is a schematic diagram of a wavelength tunable light source 101 according to an embodiment. The wavelength tunable light source 101 has a light source module 10, and a TLS controller 500 that controls the light source module 10. The light source module 10 has a light source 20 and a wavelength monitor circuit 15, both being arranged in a package 90. The wavelength of light emitted from the light source 20 is controlled by the TLS controller 500 based upon an output of the wavelength monitor circuit 15.

At least a part of the light source 20 and at least a part of the wavelength monitor circuit 15 are provided on a substrate 13. The substrate 13 is, for example, a silicon-on-insulator (SOI) wafer. The wavelength monitor circuit 15 has a wavelength filter 150 formed on the substrate 13, and four photo detectors 31 (labeled as "PD1"), 32 (labeled as "PD2"), 33 (labeled as "PD3"), and 34 (labeled as "PD4").

The light source 20 has a semiconductor optical amplifier 11 ("SOA1"), a resonator filter 14, and an optical waveguide 131 extending between them. The semiconductor optical amplifier 11 may be provided in a terrace or a recess formed in the substrate 13, or placed adjacent to an end face of the substrate 13 in the package 90.

A high-reflector (HR) coating 111 is formed on one end face of the semiconductor optical amplifier 11, opposite to the other end face coupled to the optical waveguide 131. A mirror or a reflector 141 is formed at the end face of the resonator filter 14 on the opposite side from the optical waveguide 131. The resonator filter 14 serves as an external resonator. Light of a specific wavelength is amplified by being bounced back and forth between the HR coating 111 and the reflector 141, and coupled to the optical waveguide 132 at the tap-1. The resonator filter 14 is, for example, a ring filter in which one or more ring waveguides are arranged, and the resonant frequency is determined by the circumference of the ring, the index of refraction of the waveguide, and so on.

A portion of the light travelling through the optical waveguide 132 is branched into the optical waveguide 133 at the tap-2, and amplified by the semiconductor optical amplifier 12 ("SOA2"). The amplified light is split by the beam splitter 17, and a part of light (e.g., a reflected light component) is detected by the power monitor (PDm) The detection result is used at the TLS controller 500 to perform feedback control on the SOA2. For the sake of simplification of the figure, interconnections between the power monitor 21 and the TLS controller 500 are omitted in FIG. 4. The light transmitted through the beam splitter 17 becomes output light of the light source module 10.

The light that continues to propagate through the optical waveguide 132 from the tap-2 is incident on the wavelength filter 150. The wavelength filter 150 has an optical splitter 151 for splitting the input light into two paths, optical waveguides 152 and 153 extending from the optical splitter 151 at different lengths, and an optical mixer 154. At the optical mixer 154, the light beams incident from, the optical waveguides 152 and 153 interfere with each other, and four light components with optical phases shifted by 90 degrees from one another are output from the optical mixer 154. The optical splitter 151 is, for example, a 3 dB coupler that equally divides the input light and output the divided light components attenuated by 3 dB in the forward direction. The optical mixer 154 is a 90-degree hybrid with four output waveguides 156a, 156b, 156c and 156d. The output waveguides 156a to 156d are optically connected to corresponding photo detector 31 (labeled as "PD1"), photo detector 32 (labeled as "PD2"), photo detector 33 (labeled as "PD3"), and photo detector 34 (labeled as "PD4"), respectively. The light beams emitted from the output waveguides 156a to 156d may be guided onto the photo detectors 31 to 34 using optoical elements such as mirrors and/or lenses. Alternatively, spot size converters may be formed at the ends of the respective output waveguides 156a to 156d, and the propagated light may be guided to the corresponding photo detectors 31 to 34 by optical fibers.

The above-described configuration is advantageous because no additional tap or branching section is needed before the wavelength filter 150, and because optical loss of the light input to the wavelength filter 150 is reduced. The resonator filter 14, the optical waveguides 131, 132 and 133, and the wavelength filter 150 are monolithically formed over a substrate 13, and a compact structure can be achieved without increasing the number of taps.

Four light components output from the optical mixer 154 are received at the photo detectors 31 ("PD1"), 32 ("PD2"), 33 ("PD3"), and 34 ("PD4"), respectively. The quantities of the photocurrents detected by the photo detectors 31, 32, 33, and 33 are supplied to the TLS controller 500 and used for wavelength control.

The TLS controller 500 has a processor 510 and a memory 520, and it controls an electrc current for controlling the wavelength of the light source 20. In the embodiment, the output levels of the respective photo detectors (which may be called as "PD outputs") are normalized. Let the photocurrents detected by the photo detectors 31, 32, 33 and 34 be denoted as I1, I2, I3, and P4, respectively. The summation of the photocurrents I1 to I4 is used as a denominator for the normalization of the PD outputs. To be more precise, one or more of the four photocurrents I1 to I4 is/are selected to calculate a current ratio to the total of the photocurrents (I1+I2+I3+I4). The level of the electric current applied to the resonator filter 14 is controlled so as to bring the calculated current ratio to a target value.

Figure 5:
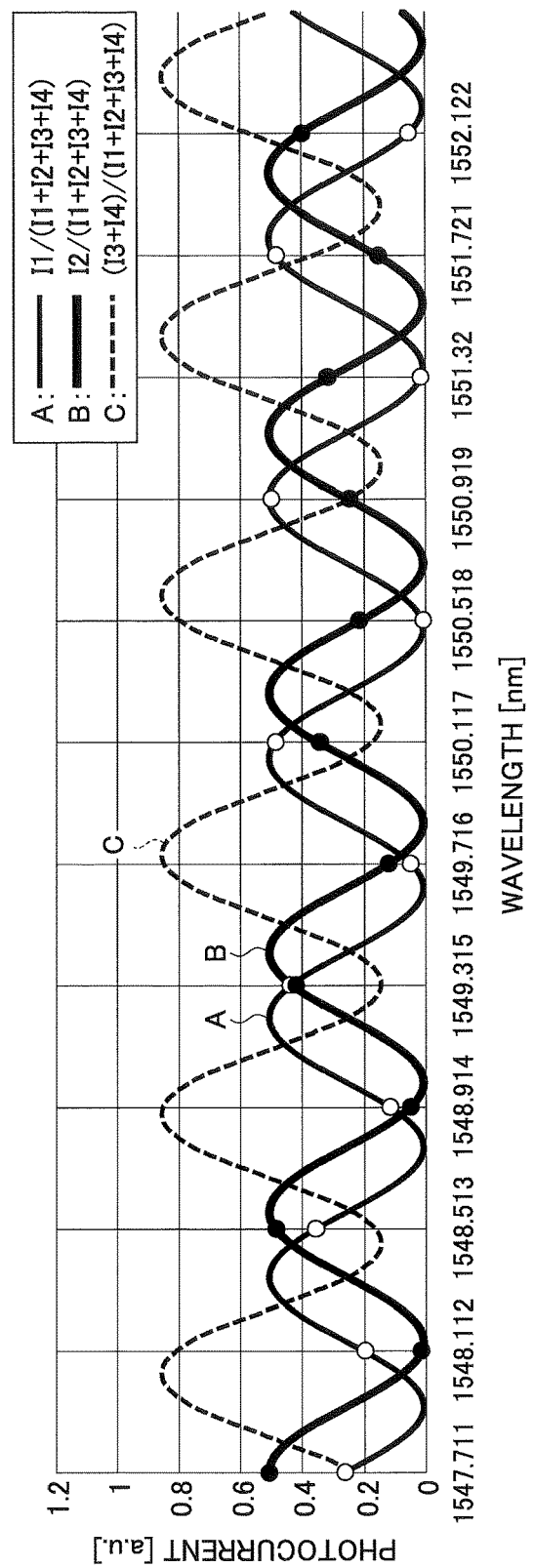
FIG. 5 illustrates transmission spectra of the wavelength filter of the embodiment calculated from photocurrents output from four PDs.

FIG. 5 illustrates transmission spectra of the wavelength filter 150 of the embodiment using current ratios calculated from the photocurrents output from the photo detectors 31, 32, 33, and 34. The horizontal axis represents wavelength (nm) and the vertical axis represents normalized photocurrent level. Spectrum A indicates a current ratio I1/(I1+I2+I3+I4). Spectrum B indicates a current ratio I2/(I1+I2+I3+I4). Spectrum C indicates a current ratio (I3+I4)/(I1+I2+I3+I4), where the sum of the photocurrents output from the photo detector 33 (or PD3) and the photo detector 34 (or PD4) is a numerator.

The grid in FIG. 5 is a fixed grid of 50 GHz spacing. At any wavelength, the slope (s) of one or more spectra are sufficiently large, which means that the rate of change in the monitored current is great and high sensitivity is achieved. When choosing a single photocurrent value and normalizing by the total current (I1+I2+I3+I4), a current ratio spectrum that does not become zero or a peak at uhe target wavelength is selected from the multiple spectra. For example, for a system carrying out wavelength division multiplexing (WDM) in the wavelength band of 1550 nm to 1552 nm, the spectrum B of the photocurrent I2 normalized by the total output current of the wavelength filter 150 may be selected in advance. When choosing two photocurrent values and normalizing each of them by the total current (I1+I2+I3+I4), either one of the current ratio spectrums with a greater slope at the target wavelength is selected to control the wavelength of the light source. For instance, when photocurrents output from PD1 and PD2 are selected to calculate I1/(I1+I2+I3+I4) and I2/(I1+I2+I3+I4) and when the target wavelength is 1550.919 nm, then spectrum B which has the greater slope is used. In this specific circumstance, spectrum. A may not be a suitable one to perform accurate wavelength control because the current ratio becomes a peak at or near the target wavelength and uhe rate of change as a function of wavelength becomes small.

By using the summation of the photocurrents output from the four photo detectors 31, 32, 33 and 34 for normallization, the monitored light is divided or normalized by the total quantity of the light components with optical phases shifted by 90 degrees from one another. Regardless of whichever of the PD outputs being selected, a sine wave transmission spectrum can be acquired for any wavelength.

The TLS controller 500 controls the resonance frequency of the resonator filter 14 such that the monitored current ratio approaches the target ratio. With spectrum B selected at the wavelength 1550.919 nm, an electric current applied to the resonator filter 14 is adjusted for controlling the index of refraction thereof such that the current ratio I2/(I1+I2+I3+I4) becomes or approaches 0.25.

The monitored current ratio is calculated by the processor 510 of the TLS controller 500 based upon the photocurrents output from the photo detectors 31, 32, 33, and 34. The TSL controller 500 may have information about the transmission spectra of the wavelength filter 150 in the memory 520, Such information may be measured in advance, for example, before shipment. When a wavelength is designated for services or operations, the TLS controller 500 refers to the memory 520 and selects a current ratio spectrum that has the greatest slope at the designated wavelength. During the services, the processor 510 calculates the current ratio from the photocurrents output from the photo detectors 31, 32, 33 and 34, and controls the resonance frequency of the resonator filter 14 so as to bring the calculated ratio to be closer to the target ratio.

Figure 1:
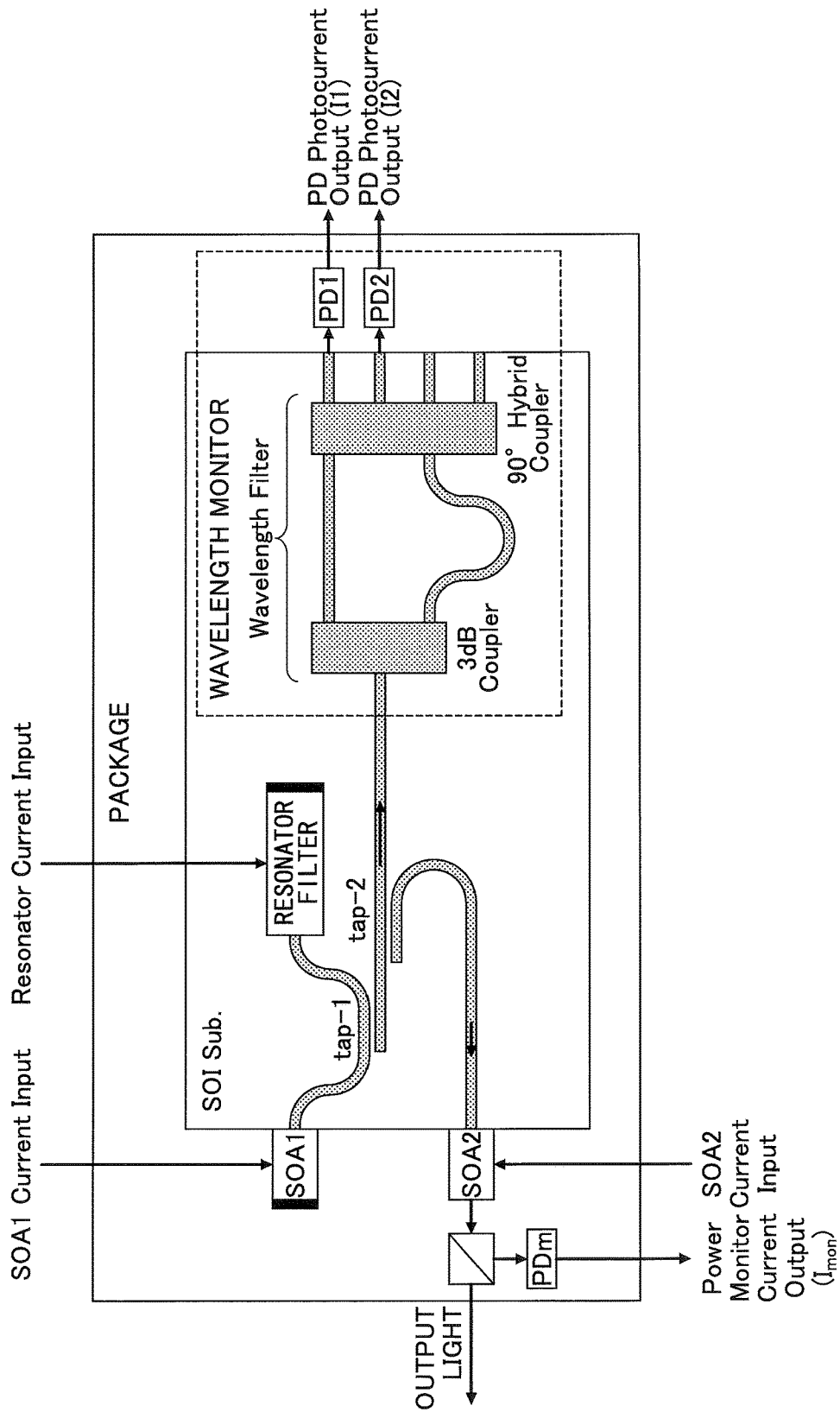
FIG. 1 illustrates a conventional wavelength monitor circuit.
Figure 2:
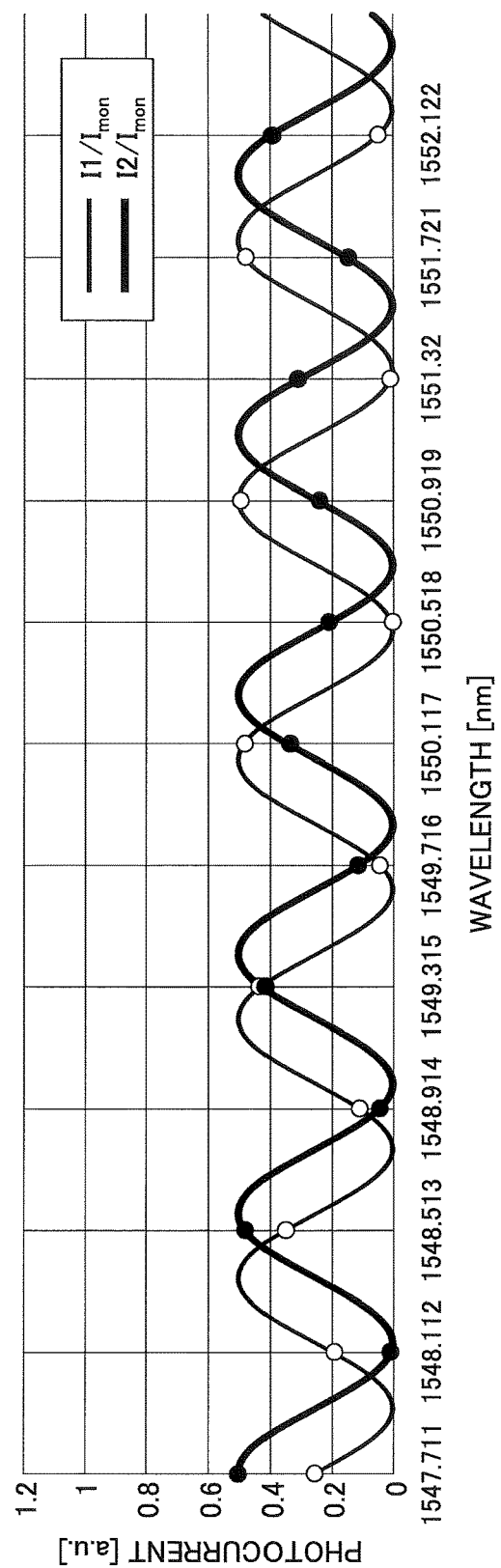
FIG. 2 illustrates spectra of the current ratios of two photodiodes over the output current of the power monitoring diode (PDm)
Figure 3:
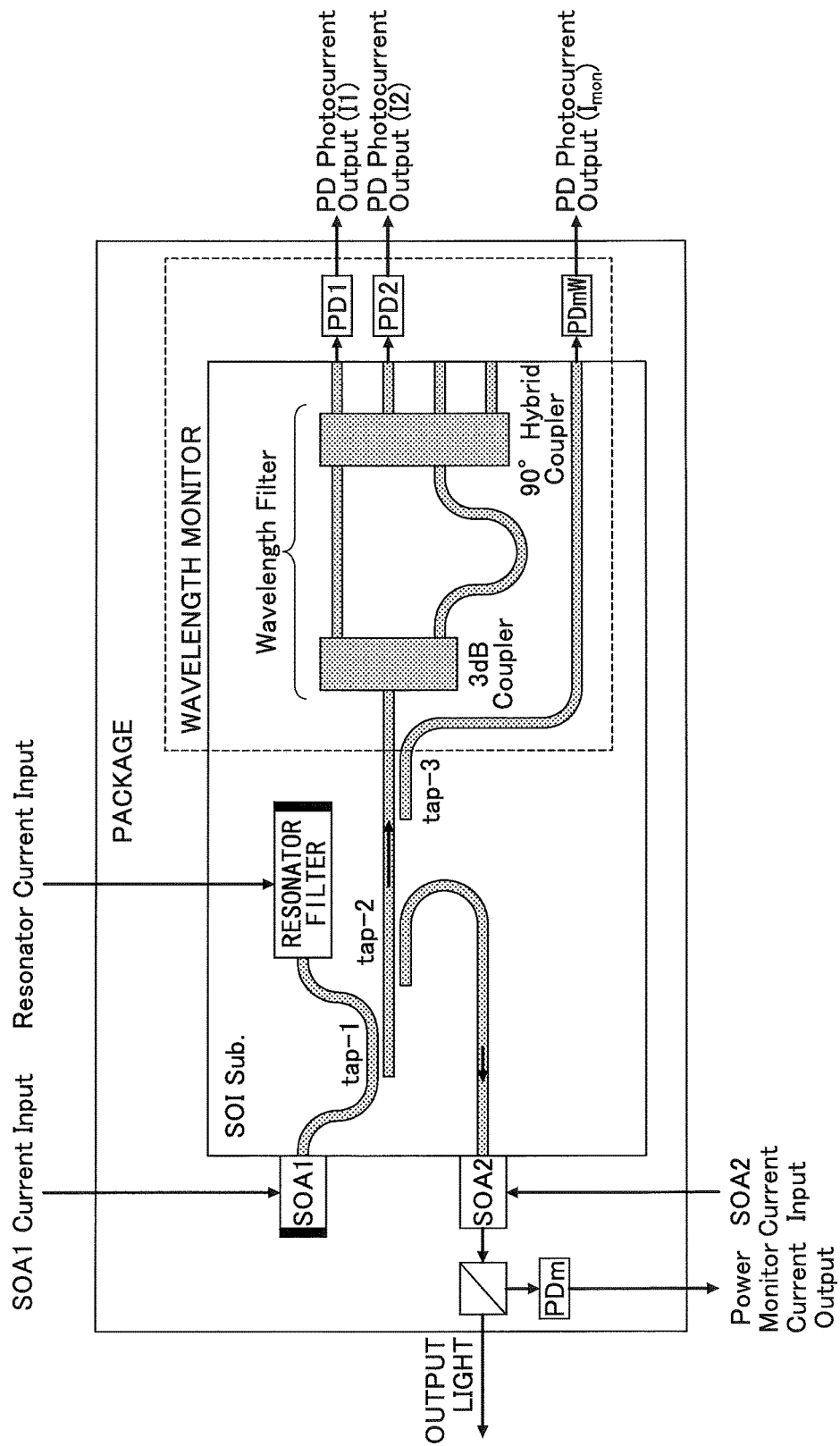
FIG. 3 illustrates another known structure of a wavelength monitor circuit.

In the conventional configuration illustrated in FIG. 1 and FIG. 2, a current ratio over $I_{mon}$ is calculated using monitor light that does not pass through a wavelength filter (namely, without periodic change). In contrast, in the embodiment, the total sum of the photocurrents detected from the light components having passed through the wavelength filter 150 with a periodically changing transmission characteristic is used as a denominator for the normalization. Whichever of the photocurrents is selected as a numerator, a sine wave, transmission spectrum can be acquired in a stable manner for any wavelength.

Even if the light incident on the wavelength filter 150 from the tap-2 fluctuates, the ratio calculated from the photocurrents detected by the photo detectors 31 (or PD1), 32 (or PD2), 33 (or PD3), and 34 (or PD4) is not affected, and therefore, stable wavelength monitoring can be realized. Besides, the entirety of light taken out from tap-2 can be monitored and the optical loss can be reduced in wavelength monitoring by the wavelength monitor circuit 15.

The photo detectors 31 to 34 may be formed in the substrate 13 instead of arranging individual photo detectors in the package 90, as is described below. Such a built-in structure can reduce the assembling cost and the sizes and the number of components.

<Modification 1>

Figure 6:
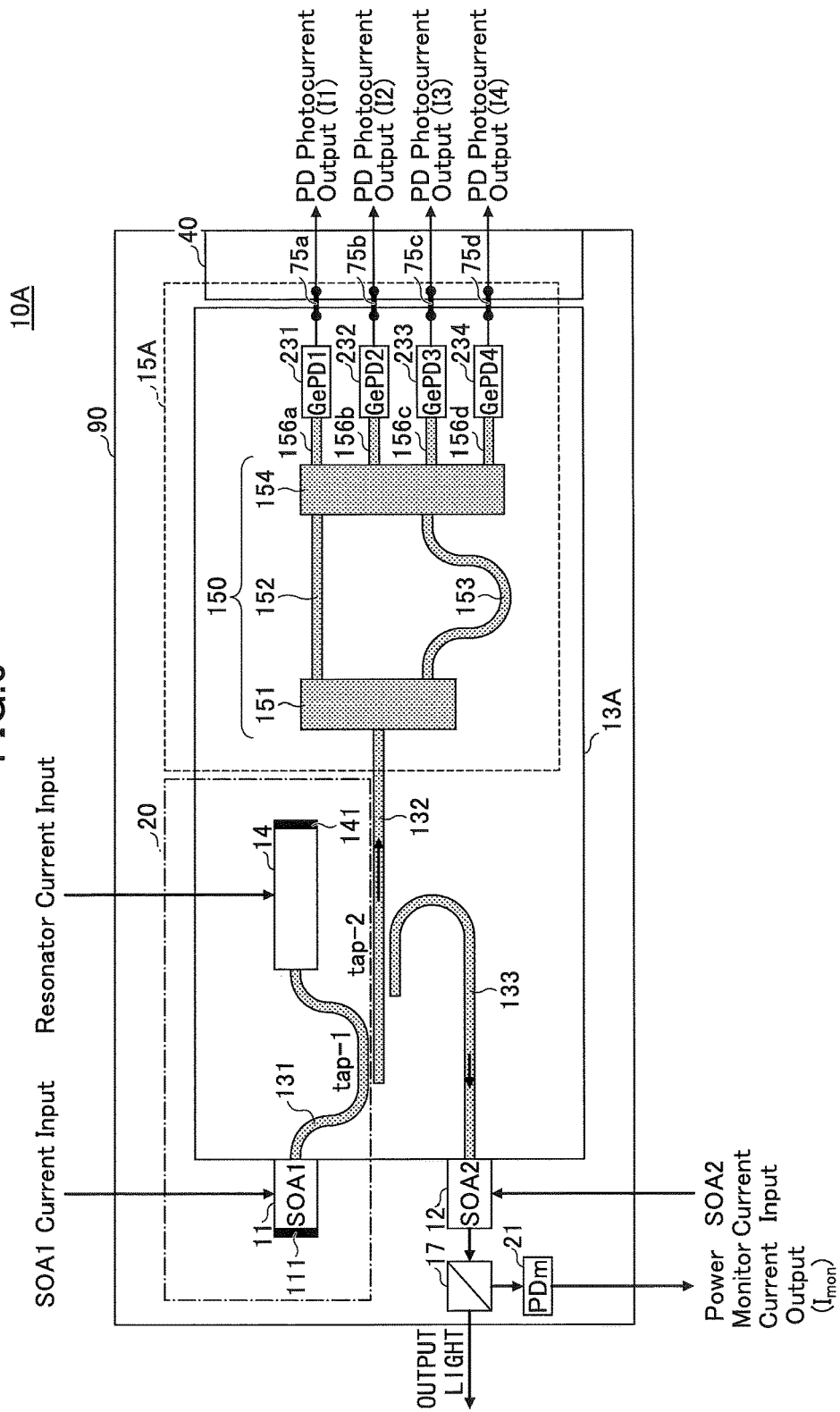
FIG. 6 illustrates a first modification of the light source module used in the wavelength tunable light source of FIG. 4.

FIG. 6 illustrates a light source module 10A, which is a first modification of the light source module 10 of FIG. 4. The wavelength monitor circuit 15A of the light source module 10A has germanium photodiodes (GePD1 through GePD4) fabricated in the substrate 13A, which are devices serving as photo detectors 231 through 234.

The substrate 13A is, for example, a SOI wafer. Output waveguides 156*a* to 156*d* extending from the optical mixer 154 are respectively connected to the corresponding GePD1 to GePD4. The germanium photodiodes can accommodate a wide range of wavelengths from 800 nm to 1700 nm, and they are used appropriately for optical communications in the 1500 nm-band By fabricating the germanium photodiodes GePD1 to GePD4 in the substrates the size of the photo detectors is greatly reduced and the coupling loss is also reduced. An interposer 40 may be used to receive the photocurrents from the GePD1 to GePD4 and transfer the photocurrents to the TLS controller 500. The outputs of the GePD1 through GePD4 may be connected by bonding wires 75*a* through 75*d* to metal pads formed on the surface of the interposer 40. The photocurrents I1 to I4 from the GePD1 to GePD4 may be input to the TLS controller 50 from the connection terminal of the interposer 40.

Figure 7:
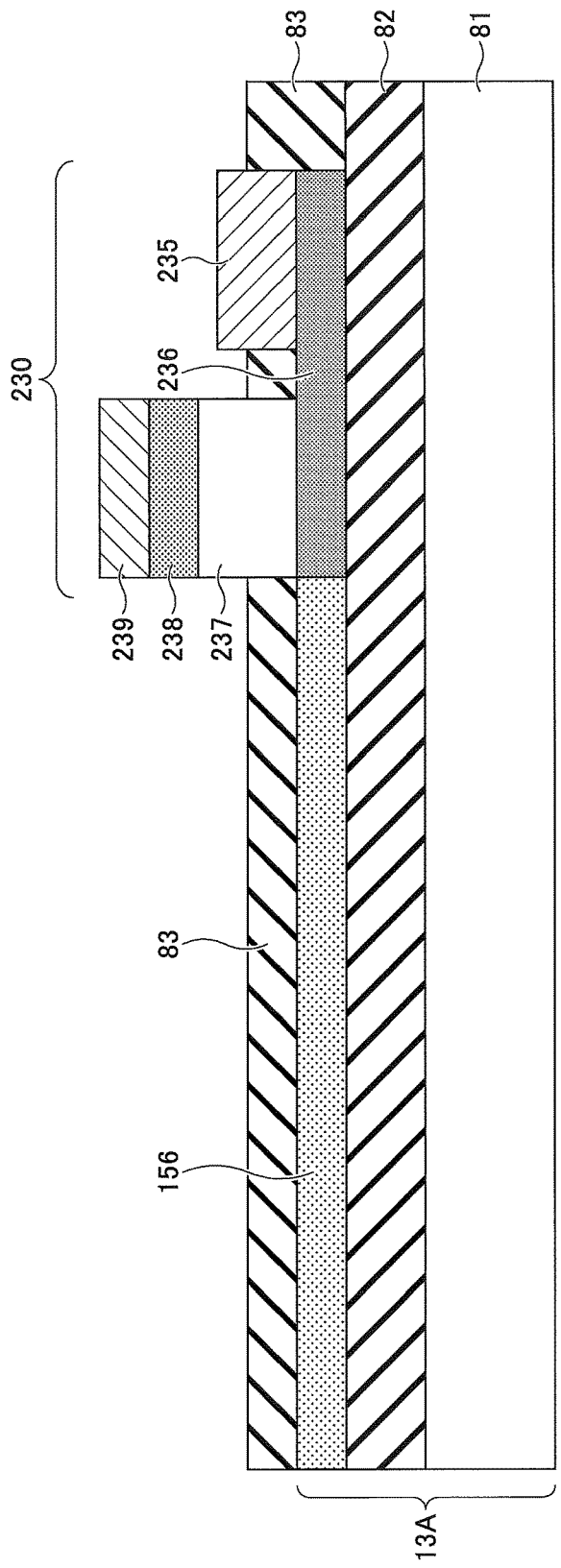

FIG. 7 is a schematic cross-sectional view of the substrate 13A in which germanium phouodiodes are fabricated. The SOI wafer used as the substrate 13A has a silicon layer grown over a buried oxide layer 82 deposited over a silicon substrate 81. The silicon layer on the buried oxide layer 82 is processed into a desired pattern of waveguides by silicon photonics technology.

The output waveguide 156 extending from the optical mixer 154 of the wavelength filter 150 is formed of an intrinsic or undoped semiconductor material. The output waveguide 156 is covered by a clad layer 83 and connected to a germanium photodiode 230. In this specific example, the germanium photodiode 230 is a PIN diode which has a layered structure with a p-type doped silicon layer 236, an intrinsic germanium (i-Ge) layer 237, and a n-type doped germanium (n-Ge) layer 238 deposited in this order. A top electrode 239 is provided over the n-Ge layer 238. A bottom electrode 235 is connected to the p-Si layer 236. Reverse bias voltage is applied across the GePD 230. When light traveling through the output waveguide 156 and incident on the p-Si layer 236 is absorbed in the i-Ge layer 237, electrons travel toward the n-Ge layer 238 and photocurrent is output from the GePD 230.

Figure 8:
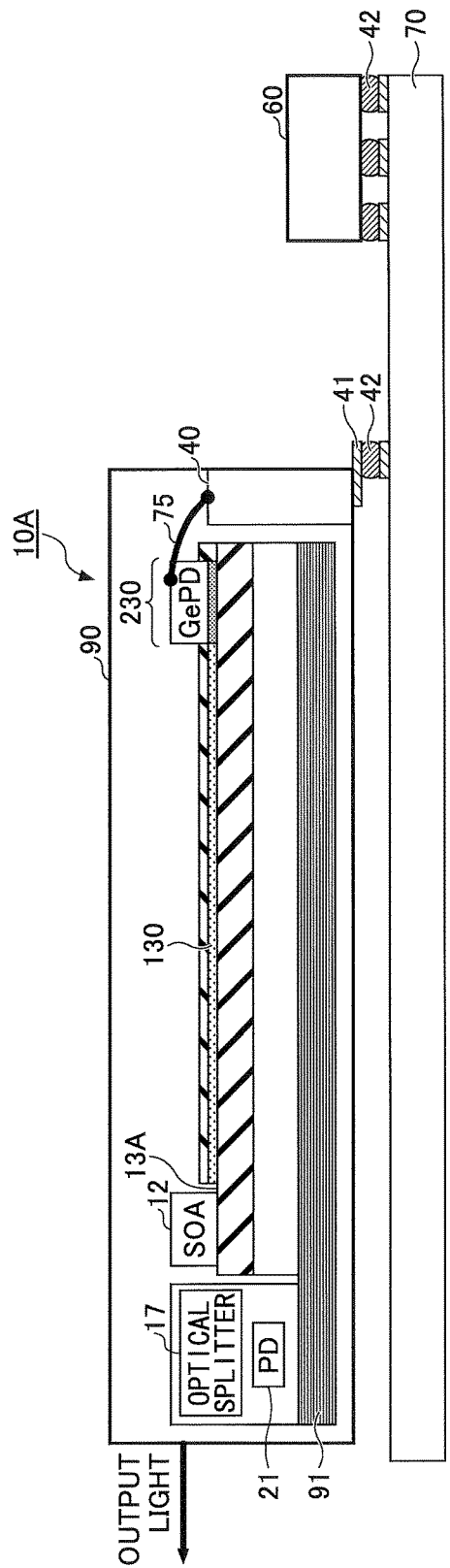
FIG. 8 illustrates an example of assembly of the wavelength tunable light source in which a package, an interposer, and a LSI chip are mounted on a circuit board.

FIG. 8 is a schematic cross-sectional diagram of the light source module 10A, which is mounted on a circuit board 70. The substrate 13A with an optical waveguide 130 formed therein is mounted on a carrier 91 within the package 90. A beam splitter 17 and a photo detector (PD) 21 are also arranged on the carrier 91 for monitoring light output from the SOA 12. The optical waveguide 130 includes the optical waveguides 131, 132 and 133 and the wavelength filter 150 illustrated in FIG. 6, The GePD 230 is connected to one of the output waveguides 156 of the waveguide filter 150.

The photocurrent output from the GePD 230 is supplied to the TLS controller 500 via the bonding wire 75 and the interposer 40, Through-wafer interconnects (or metal plugs) are formed in the interposer 40 and the phococurrent from the GePD 230 is output from a lead 41 provided on the back face of the interposer 40.

The package 90 and a large-scaled integrated (LSI) circuit chip 60 are mounted over the circuit board 70 by solder bumps. The TSL controller 500 may be incorporated as a logic device in the LSI circuit chip 60, or it may be formed as a separate chip and mounted over the circuit board 70 together with the LSI circuit chip 60. The photocurrent extracted from the lead 41 of the package 90 is input to the TSL controller 50 via an interconnect formed in the circuit board 70, and used to control the wavelength of the light source module 10A, This arrangement makes the structure of the wavelength monitor circuit 15 of the light source module 10A compact, while reducing optical loss.

Although in FIG. 8 the substrate 13A is connected to the interposer 40 by bonding wires 75, the invention is not limited to this specific example. The substrate 13A may be stacked over the interposer 40 and electrically connected by micro bumps. In this case, the photocurrents output from the GePD1 through GePD4 are supplied to the interposer 40 by through-sjlicon vias and micro bumps, and output from the package 90 by the through-wafer interconnect of the interposer 40 and the lead 41.

<Modification 2>

Figure 9:
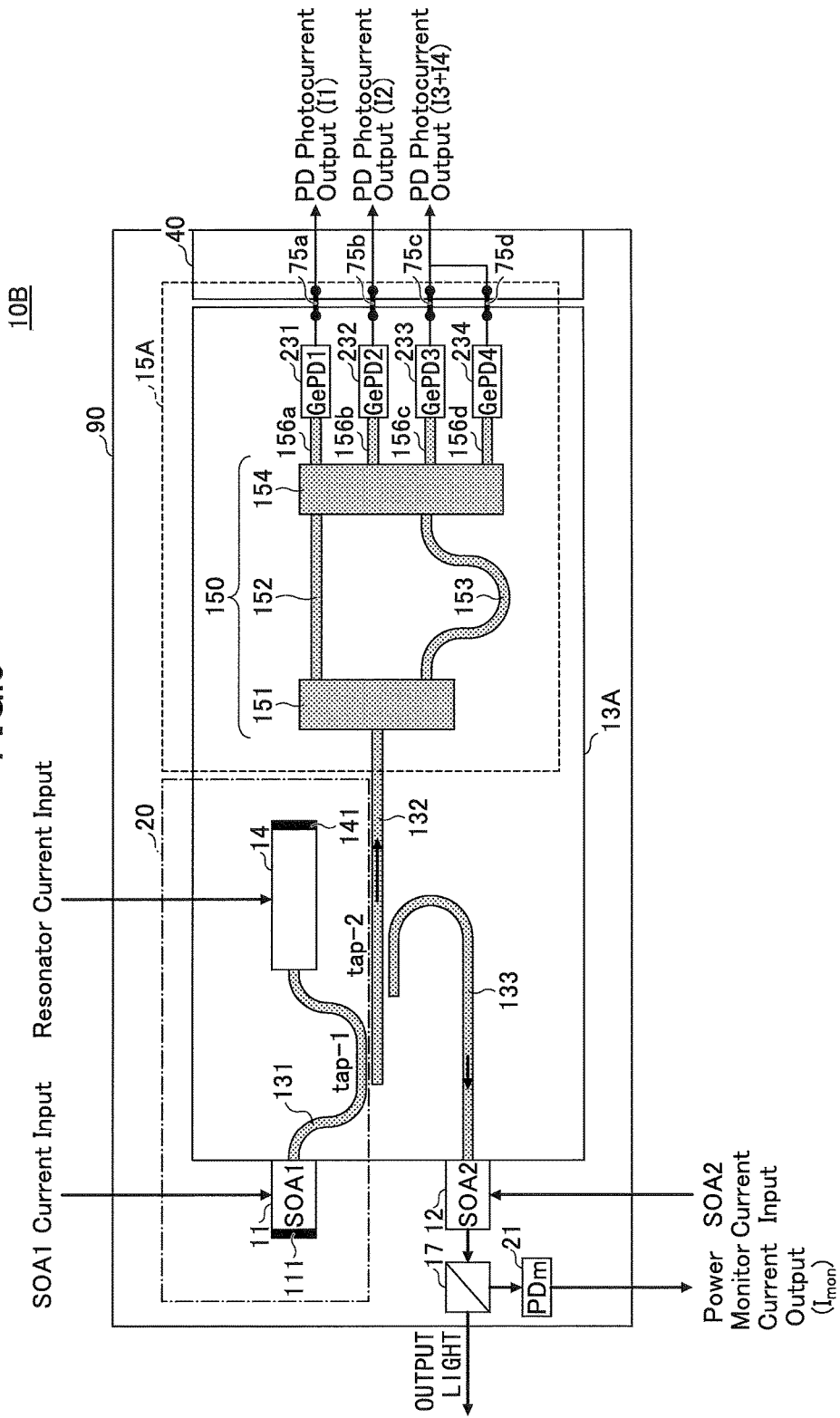
FIG. 9 illustrates a second modification of the light source module.

FIG. 9 illustrates a light source module 10B, which is an example of a second modification. The light source module 10B has germanium photodiodes (GePD1 through GePD4) fabricated in the substrate 13A, serving as photo detectors 231 through 234 as in the light source module 10A of FIG. 6.

One difference from FIG. 6 is that photocurrents of the GePD1 through GePD4 are supplied by three current paths from the light source module 10B to the TLS controller 500. Three current values supplied to the TLS controller 500 are, for example, photocurrent I1 from GePD1, photocurrent I2 from GePD2, and a combination of I3 and I4 (I3+I4) outputs of GePD3 and GePD4, respectively.

The circuit design of the optical wave-guides formed in the substrate 13A is the same as that illustrated in FIG. 6, in which the GePD1 through GePD4 are respectively connected by bonding wires 75a through 75d to the interposer 40. The photocurrent I3 from the GePD3 and the photocurrent I4 from GePD4 are merged at the interposer 40 and a merged photocurrent is supplied as one of the three current values to the TLS controller 500. The combination of photocurrents to be merged is not limited to I3 and I4. Any two of the four photocurrents output from the photo detectors 231 to 234 can be merged, while the other two photocurrents may be treated as individual current signals.

In the configuration of FIG. 9, the number of the leads 41 (see FIG. 6) of the package 90 can be reduced as compared with the configuration of FIG. 6. Reducing the number of the leads 41 means that the number of connections between the circuit board 70 and the LSI circuit chip 60, and the number of connections between the package 90 and the circuit board 70 can be reduced. This configuration is advantageous because the workload for substrate design and assembling can be reduced.

Reducing the number of the leads 41 of the package 90 does not influence the operations of the TLS controller 500. The TLS controller 500 can acquire the total sum of the photocurrents from GePD1 through GePD4 based upon the received values of I1, I2 and (I3+I4), and normalise one or more photocurrent(s) using the total sum (I1+I2+I3+I4) to calculate a current ratio. The TLS controller 500 compares the calculated ratio with the target ratio to control the wavelength. With this arrangement, the attenuation of the output power at the SOA2 site and the optical loss at the wavelength monitor circuit 15 site are both reduced. Accordingly, low loss and stable wavelength control can be achieved.

<Modification 3>

Figure 10:
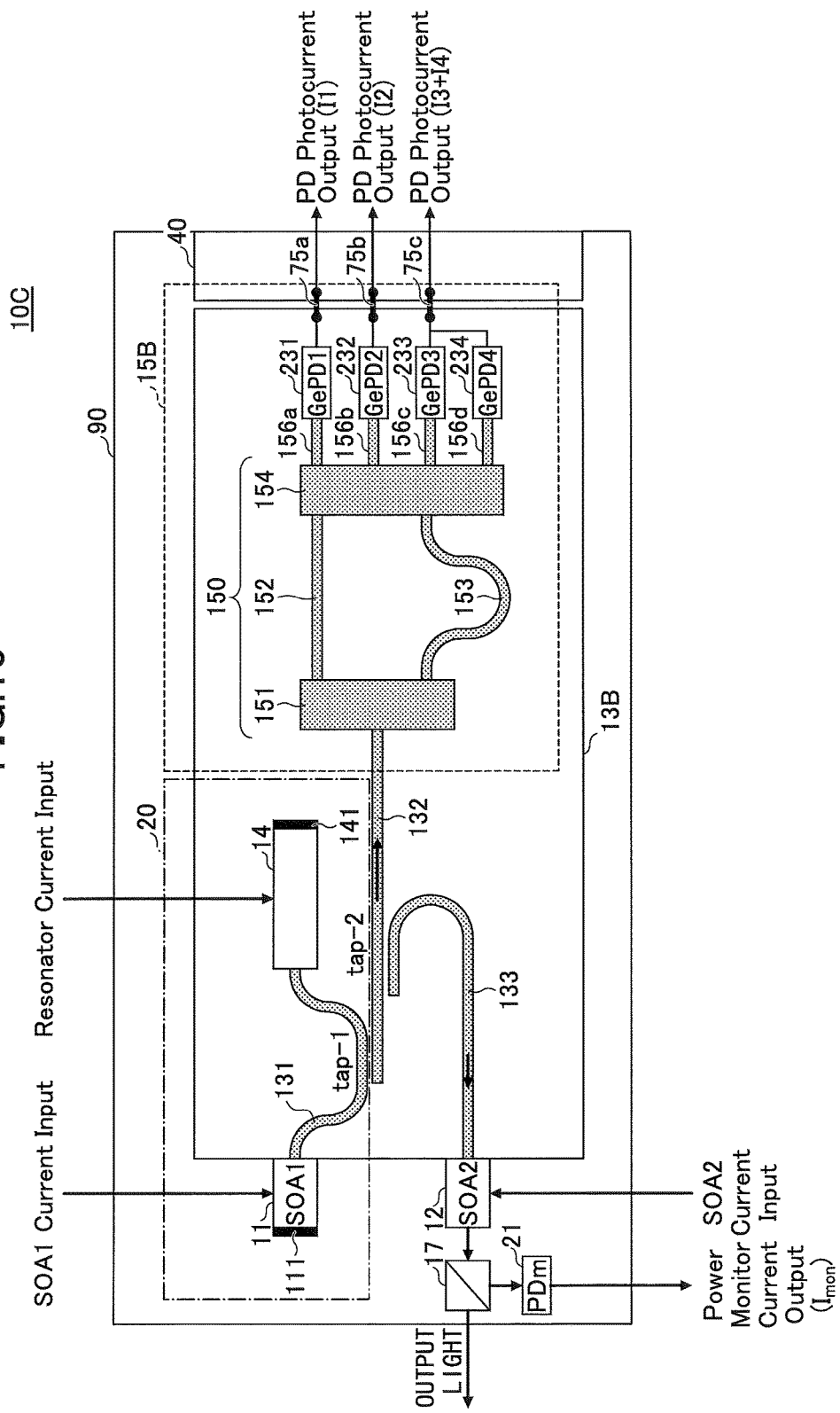
FIG. 10 illustrates a third modification of the light source module.

FIG. 10 illustrates a light source module 10C, which is an example of a third modification. The light source module 10C has germanium photodiodes (GePD1 through GePD4) fabricated in the substrate 13A, which are devices serving as the photo detectors 231 through 234, as in the first and second modifications.

As in the second modification, the TLS controller 500 receives photocurrent I1 from GePD1, photocurrent I2 from GePD2, and merged photocurrent (I3+I4) from GePD3 and GePD4, through three current paths.

One difference from the second modification is that the two photocurrents are merged in the substrate 13B, which results in a decreased number of bonding wires connecting between the substrate 13B and the interposer 40. The photocurrent output from GePD1 is supplied through the bonding wire 75a to the interposer 40. The photocurrent output from GePD2 is supplied through the bonding wire 75b to the interposer 40. The photocurrents from GePD3 and GePD4 are merged in the substrates 13B and supplied through the bonding wire 75c to the interposer 40.

The configuration of FIG. 10 is advantageous because a current confluence path can be formed easily in the substrate 13B in the same process of silicon photonics for fabricating the optical waveguides and the wavelength filter 150. The number of bonding wires 75 between the substrate 13B and the interposer 40, and the number of leads 41 (see FIG. 8) of the package 90 can be reduced. Bonding wires can be eliminated by employing a stacked structure with the substrate 13A mounted over the interposer 40. In this case, the number of interconnections between the substrate 13B and the relay substrate 40 can be reduced.

<Modification 4>

Figure 11:
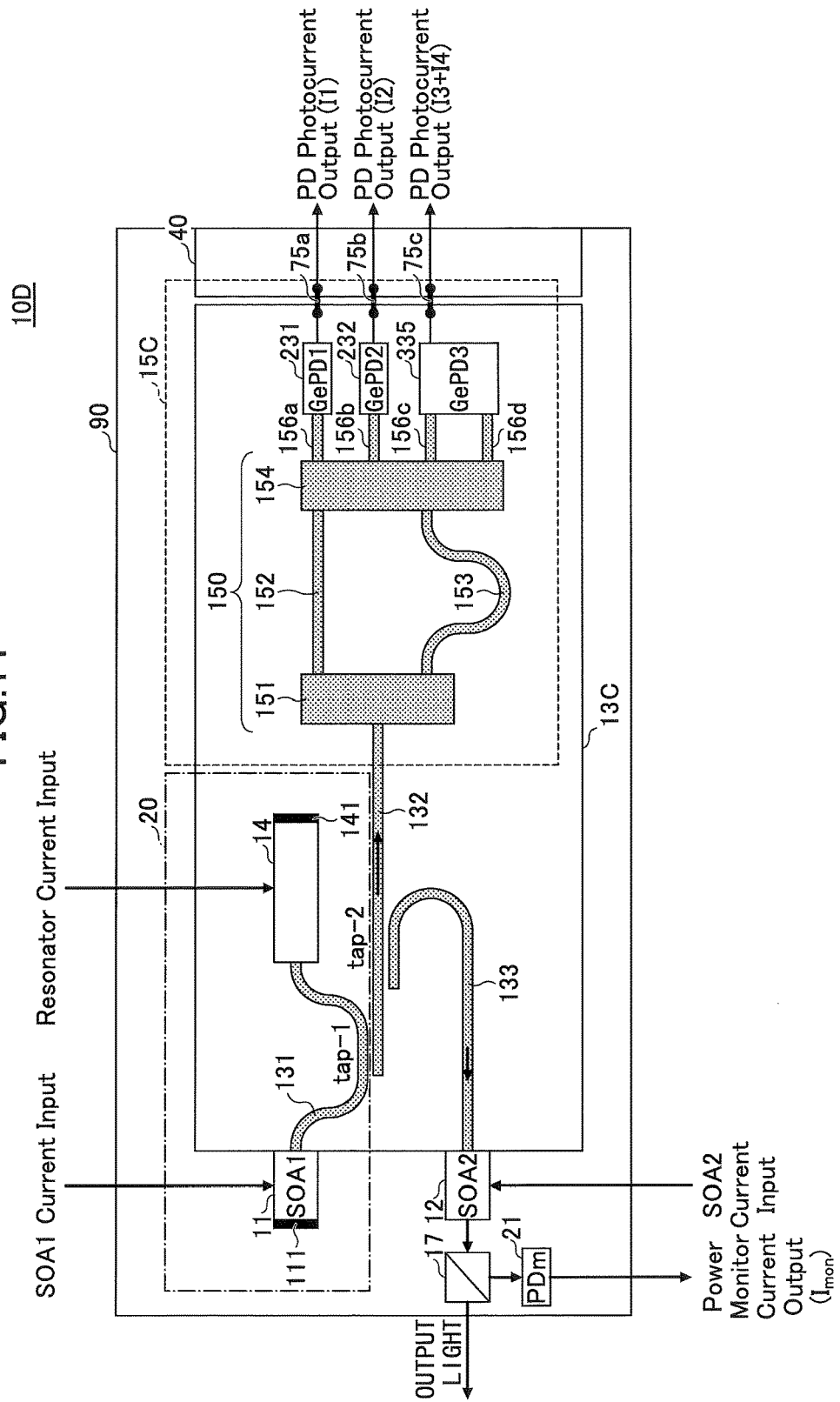
FIG. 11 illustrates a fourth modification of the light source module.

FIG. 11 illustrates a light source module 10D, which is an example of a fourth modification. The light source module 10D has three germanium photodiodes (GePD1, GePD2 and GePD3) fabricated in the substrate 13C, which are devices serving as the photo detectors 231, 232 and 335.

Among the four output waveguides 156a to 156d of the optical mixer 154 of the wavelength filter 150, the output waveguide 156a and the output waveguide 156b are connected to the GePD1 and GePD2, respectively. The output waveguides 156c and 156d are connected commonly to the GePD3. The light components travelling through the output waveguides 156c and 156d have optical phases shifted by 90 degrees from each other, and accordingly, these light components are incident on the GePD3 without interference between them. The photocurrent output from the GePD3 is the sum of the photocurrent I3 detected from the light component through the output waveguide 156c and the photocurrent I4 detected from the light component through the output wavecuide 156d. The photo detector configured to receive two orthogonal light components is not limited to the photo detector 335 (GePD3) connected to the output waveguides 156c and 156d. The output waveguides 156a and 156b may be connected to a single photo detector, while each of the other two output waveguides 156c and 156d may be connected individually to the corresponding one of the two other photo detectors. Alternatively, the output waveguides 156b and 156c may be connected to a single photo detector, and each of the other two output waveguides 156a and 156d may be connected individually to the corresponding one of the two other photo detectors.

The configuration of FIG. 11 is advantageous because the number of photocurrent paths taken out of the substrate 13C is reduced easily using silicon photonics technology, and the total sum of the photocurrents can be detected correctly based upon the four light components from the optical mixer 154. The number of connections between the substrate 13C and the interposer 40, and the number of connections between the package 90 and the circuit board 70 can be reduced. The workload for substrate design and assembling can be reduced. The reduced number of the photo detectors in the substrate 13C does not affect the operations of the TLS controller 500. The TLS controller 500 can normalize the selected photocurrent (s) using the total sum of the photocurrents detected from all the light components from the wavelength filter 150. Even if the power level of the light input from tap-2 to the wavelength monitor circuit 15C fluctuates, low loss and stable wavelength control can be achieved.

<Control Configuration>

Figure 12:
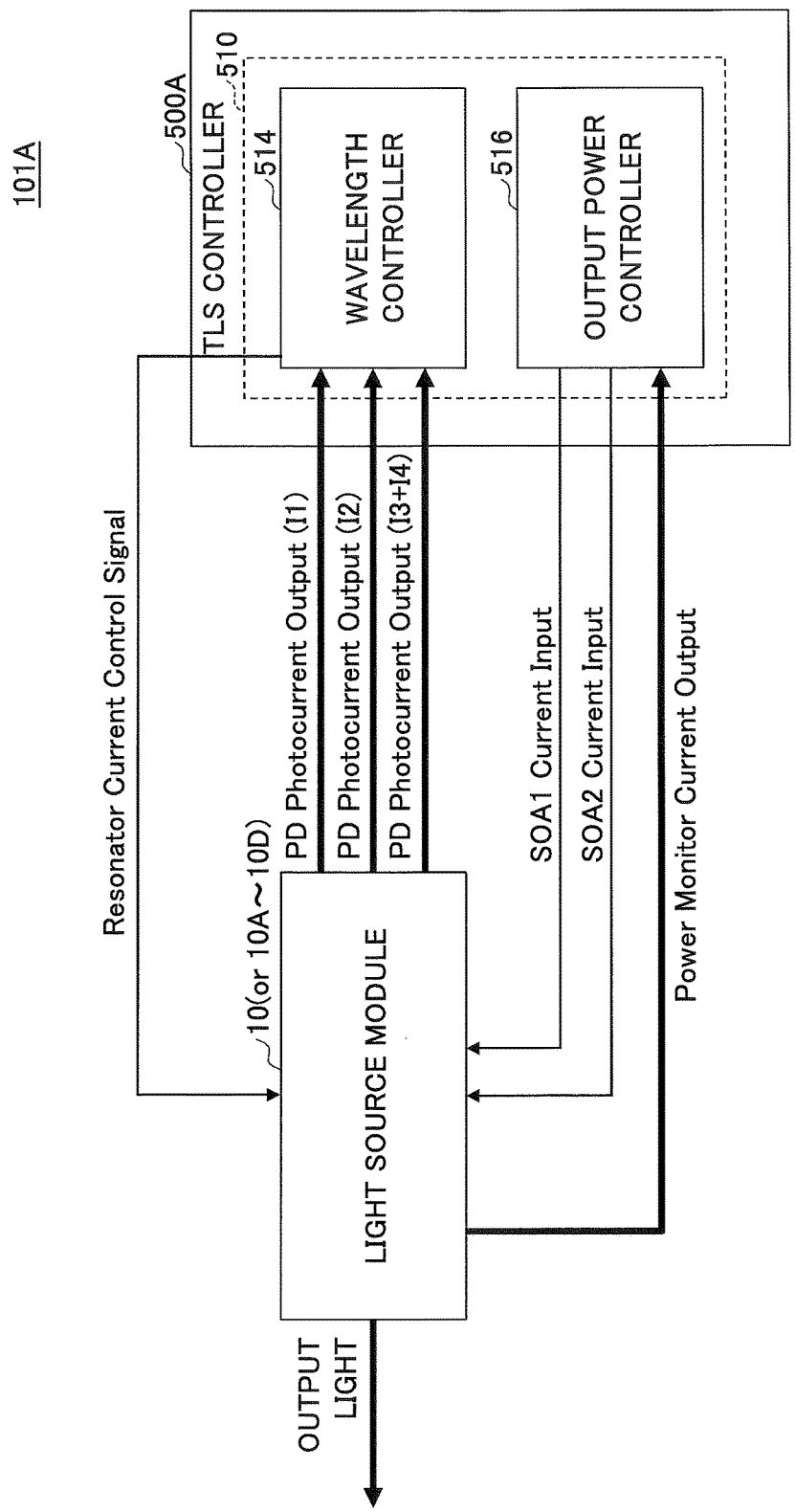
FIG. 12 is a schematic diagram of a wavelength tunable light source using a light source module.

FIG. 12 is a block diagram of a wavelength tunable light source 101A according to an embodiment of the invention. The wavelength tunable light source 101A has a light source module 10 and a TLS controller 500A Any one of the light source modules 10A through 10D described above may be used in place of the light source module 10. In the following descriptons, light source modules 10A to 10D may be referred to collectively as "light source module 10". The TLS controller 500A has a wavelength controller 514 that controls the wavelength of the light source module 10, and an output power controller 516 that controls the power level or the intensity of the output light of the light source module 10.

The light source module 10 supplies photocurrents I1, I2, I3, and I4 which represent the quantities of four light components output from the wavelength filter 150. The four light components have optical phases shifted by 90 degrees from one another. In the example of FIG. 12, photocurrents I2, I3 and I4 are supplied as three monitor signals to the wavelength controller 514, based upon the configurations of the second through fourth modifications. In the figure, the first monitor signal is a PD photocurrent I1, the second monitor signal is a PD photocurrent I2, and the third monitor signal is a combination of PD photocurrents I3 and I4. As already stated above, the invention is not limited to this specjfic example. An appropriate combination of two photocurrents may be selected for current confluence. Alternatively, the photocurrents I1, I2, I3, and I4 may be output separately as four monitor signals to the wavelength controller 514 of the TLS controller 500A.

The wavelength controller 514 selects one or more photocurrents from among uhe photocurrents I1 to I4 and calculates a current ratio normalized by the total sum of the photocurrents I1 to I4, for each or the combination of the selected photocurrents. When two or more photocurrents are selected for calculating normalized current ratios, one of the current ratio spectra with the greatest slope at the designated wavelength is used. The wavelength controller 514 controls the wavelength of the light source module 10 such that the calculated current ratio approaches the target ratio at the designated wavelength. To be more specific, the electric current applied to uhe resonator is controlled for adjusting the resonance wavelength of the light source module 10.

The light source module 10 also monitors the power level of the output light of the light source module 10 using the power monitor 21 (see FIG. 4). The photocurrent detected by the power monitor 21 is supplied to the output power controller 516 of the TLS controller 500A The output power controller 516 controls the electric currents injected into the SOA1 and SOA2 based upon the monitoring result of the power monitor 21.

With this configuration, the wavelength and the power level of the output light of the light source module 10 is controlled in the wavelength tunable light source 101A.

Figure 13:
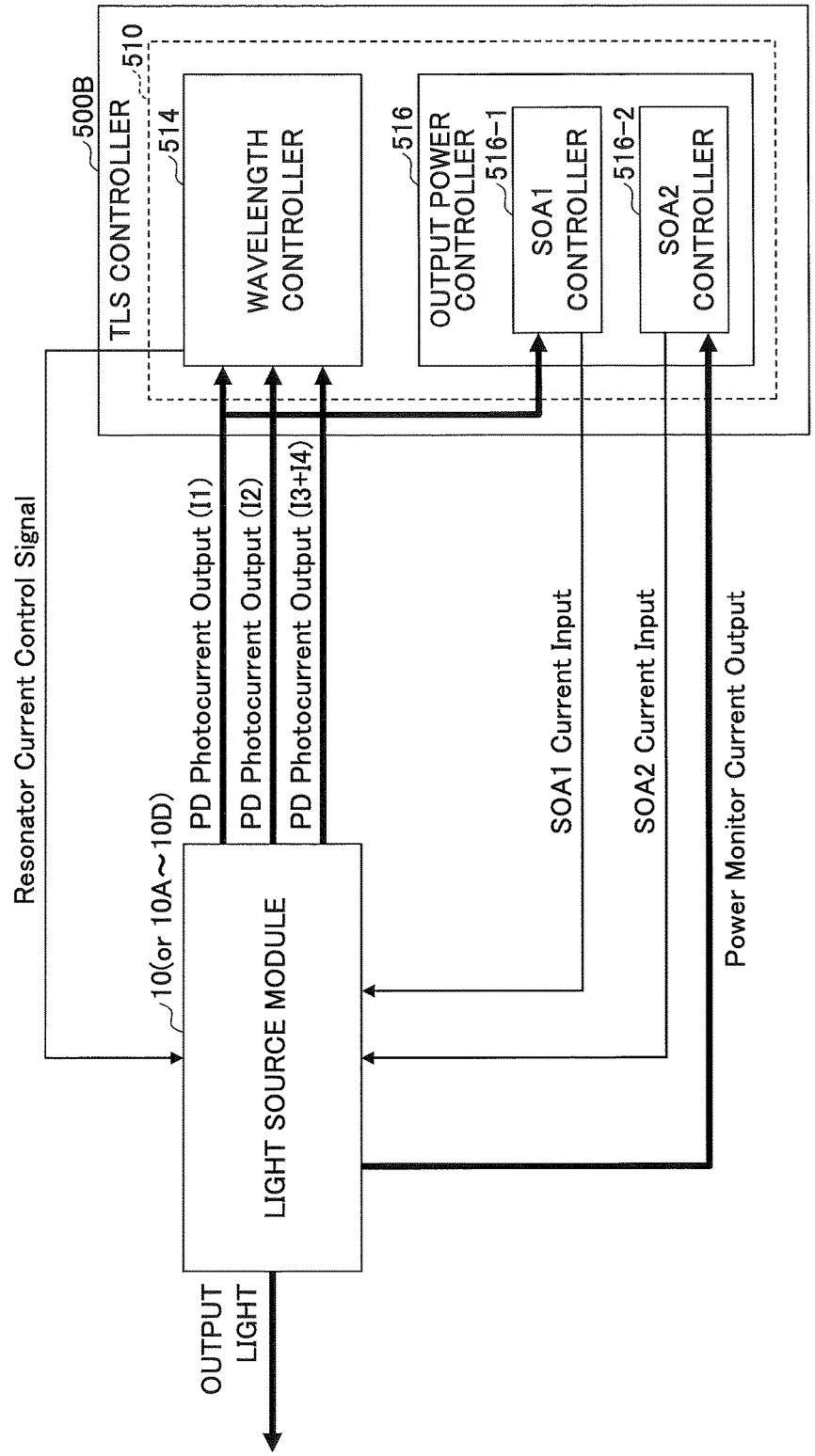
FIG. 13 is a schematic diagram of another wavelength tunable light source using a light source module.

FIG. 13 is a block diagram of a wavelength tunable light source 101B according to another embodiment of the invenljon. The wavelength tunable light source 101B has a light source module 10 and a TLS controller 500B.

As in FIG. 12, photocurrents I1, I2, I3, and I4 that represent the quantities of light components output from the wavelength filter 150 and with optical phases shifted by 90 degrees from one another are supplied from the light source module 10 to the wavelength controller 514 of the TLS controller 500B. The wavelength controller 514 calculates a current ratio using the photocurrents I1 through I4 and controls the electric current applied to the resonator so as to bring the calculated current ratio to be closer to the target ratio.

The output power controller 516 has an SOA1 controller 516-1 for controlling the SOA1 of the light source 20, and an SOA2 controller 516-2 for controlling the SOA2 used to amplify the output light. One difference from the configuration of FIG. 12 is that the photocurrent (for example, I1) selected as a numerator of the normalized current ratio for wavelength control is supplied to the SOA1 controller 516-1 and used to control the output power or the gain of the light source 20 (see FIG. 4). The SOA1 controller 516-1 controls the electric current level injected into the SOA1 based upon the photocurrent I1 received from the wavelength monitor circuit 15.

The photocurrent output from the power monitor 21 (see FIG. 4) is supplied to the SOA2 controller 516-2 and used to control the gain of the SOA2 by adjusting, for example, the current level injected into the SOA2. With the configuraton of FIG. 13, the wavelength and the output power level of the light source module 10 are controlled in the wavelength tunable light source 101B. Besides, the output power level of the light source 20 (at tap-1) is controlled independently from the control on the ultimately output light (from SOA2) of the light source module 10, making use of a portion of the photocurrents for wavelength monitoring. Consequently, the optical power control of the light source module 10 can be performed more accurately.

Figure 14:
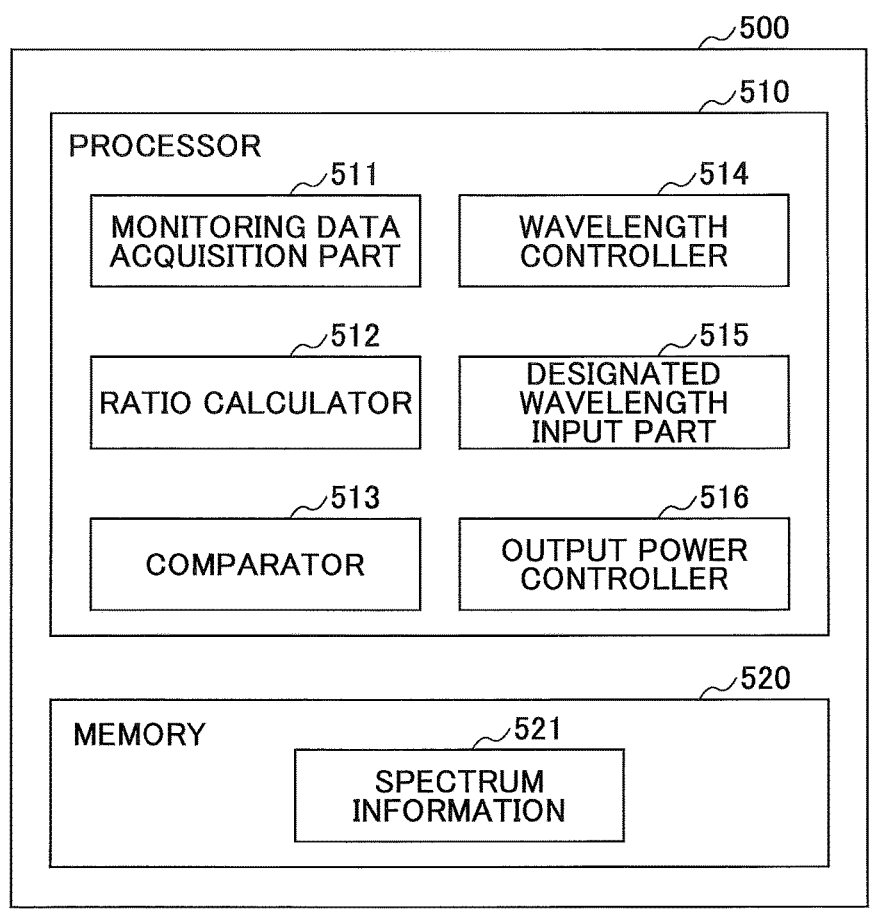
FIG. 14 is a block diagram of a TLS controller.

FIG. 14 is a functional block diagram of the TLS controller 500. The processor 510 of the TLS controller 500 has a monitoring data acquisition part 511, a ratio calculator 512, a comparator 513, a wavelength controller 514, designated wavelength input part 515, and an output power controller 516. The memory 520 of the TSL controller 500 has a spectrum information saving part 521.

The spectrum information saved in the spectrum information saving part 521 include one or more information items representing one or more transmission spectra of the wavelength filter 150 measured in advance or before shipment. Such spectrum information includes, for example, current ratio spectra illustrated in FIG. 5, or alternatively, a table created from the current ratio spectra of FIG. 5. The tabie may describe a type of the current ratio spectrum with the greatest slope, with association with the target rattio, for each of the wavelength grid lines.

When a wavelength to be set in the light source module 10 is input to the designated wavelength input part 515, the monitoring data acquisition part 511 acquires photocurrent values of the photo detectors 31, 32, 33, and 34 (or 231, 232, 233, 234). The four photocurrent values may be acquired individually, or three photocurrent values may be acquired where two of the four photocurrents may be combined into a single value. The ratio calculator 512 refers to the spectrum information saving part 521 to specify the current ratio type to be calculated at the designated wavelength, and it calculates the current ratio based upon the photocurrent values acquired by the monitoring data acquisition part 511. For example, when the wavelength of 1548.112 nm is designated, spectrum. A with the greatest slope is selected and the photocurrent I1 is chosen for normalisation. A current ratio of I1 to the total sum of the four photocurrents (I1/(I1+I2+I3+I4)) is calculated.

The comparator 513 compares the calculated current ratio with the target value, and supplies the comparison result to the wavelength controller 514. At 1548.112 nm-wavelength, the comparator 513 outputs the difference between the calculated ratio and the target ratio "0.2" to the wavelength controller 514. The wavelength controller 514 controls the wavelength of the light source 20 according to the comparison result. For example, if the calculated ratio is smaller than 0.2, the electric current applied to the heater of the resonator filter 14 is increased in order to shift the resonance wavelength to the longer side.

Figure 15:
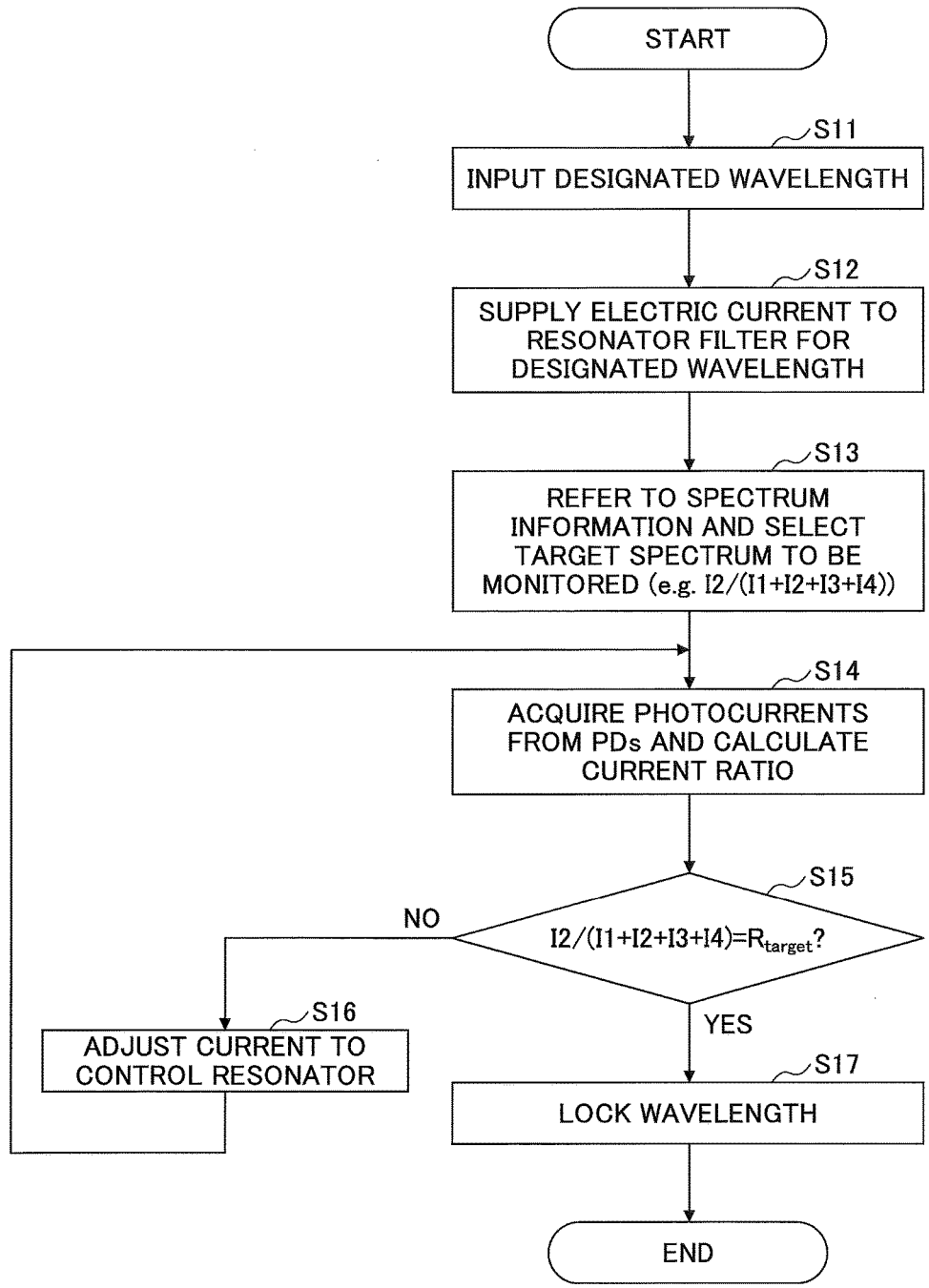
FIG. 15 is a flowchart of wavelength control operations performed by the TLS controller.

FIG. 15 is a flowchart of the wavelength control performed by the TLS controller 500. Upon input of a designated wavelength (S11), an electric current appropriate for the designated wavelength is injected to the resonator filter 14 (S12). Based upon the spectrum information stored in the spectrum information saving part 521, a current ratio (for example, I2/(I1+I2+I3+I4)) spectrum with the greatest slope at the designated wavelength is selected (S13).

The photocurrent values detected by the four photo detectors (PD1 to PD4) are obtained from the wavelength monitor circuit 15, and a current ratio of the selected spectrum is calculated (S14). Then, it is determined whether the calculated ratio is the same as the target ratio (S15). If the calculated ratio coincides with the target ratio $R_{target}$ within the acceptable error range (YES in S15), the wavelength is locked to the current wavelength (S17). In this case, the electric current level applied to the heater of the resonator filter 14 is maintained in step S12. If the calculated ratio value is offset from the target ratio $R_{target}$ (NO in S15), then the electric current input to the resonator filter 14 is adusted (S16) and steps S14 to S16 are repeated until the target wavelength is obtained. The control direction of the electric current applied to the resonator filter 14 can be determined from the sign (plus or minus) of the comparison result between the calculated ratio and the target ratio. The step size of the adjustment of the electric current may be appropriately set. With this control method, accurate wavelength control is achieved based upon iow loss and stable wavelength monitoring.

Figure 16:
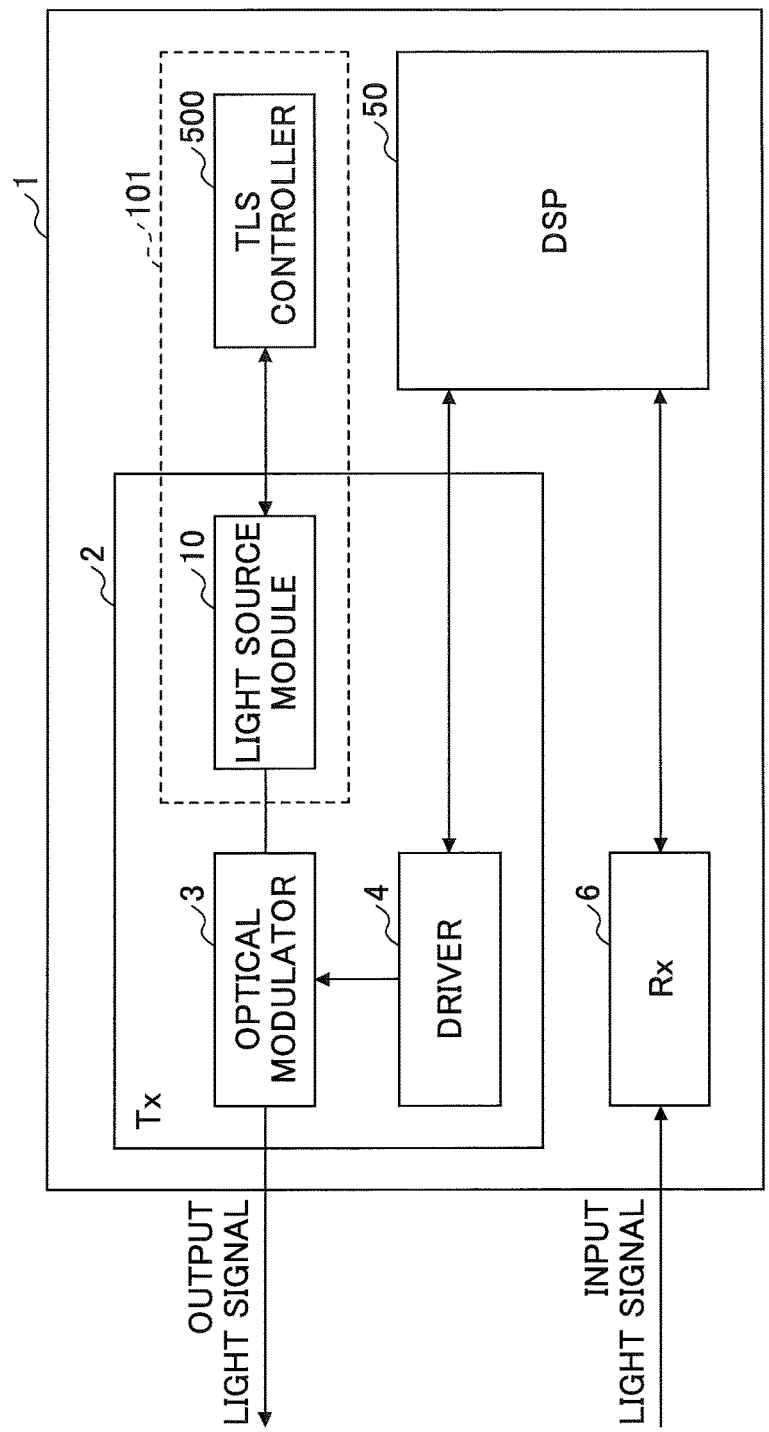
FIG. 16 is a schematic diagram of an optical transceiver using a wavelength tunable light source according to the invention.

FIG. 16 is a schematic diagram of the optical transceiver 1 using the light source module 10. The optical transceiver 1 has an optical transmitter 2, an optical receiver 6, a TLS controller 500, and a digital signal processor (DSP) 50. The TLS controller 500 may be arranged inside the optical transmitter 2.

The optical transmitter 2 has a light source module 10, an optical modulator 3, and a driver 4 for driving the optical modulator 3. The light source module 10 and the TLS controller 500 form a wavelength tunable light source 101. The wavelength of the light source module 10 is controlled to a desired wavelength used in the services under the control of the TLS controller 500. A light beam output from the light source module at a predetermined wavelength is input to the optical modulator 3. Drive signals generated by the driver 4 based upon data signals are input to the optical modulator 3 to modulate the light beam by the data signals. The modulated light beam of the predetermined wavelength is output as an optical signal from the optical transceiver 1.

The DSP 50 generates data signals to be input to the driver 4 of the optical transmitter 2. The DSP 50 also converts analog electrical signals output from the optical receiver 6 into digital signals and demodulates the data signals.

With the configuration of the embodiment, stable wavelength monitoring is realized with less optical loss in the wavelength tunable light source. The structure and process illustrated in the above-described embodiment are examples of the invention, and various modifications and alterations are possible. The light source 20 is not limited to an external-cavity light source, and a laser diode of an internal-cavity type may be used. The delay waveguide (i.e., the optical waveguide 153) of the wavelength filter 150 is not limited to the U-shaped one, and it may be curved in a W-shape. The 90° hybrid optical coupler can be realized by one or more multimode interference (MMI) waveguides. Although in the example of FIG. 4, an 501 substrate is used to monolithically form the resonator filter 14, the optical waveguides 131 to 134 and the wavelength filter 150, a compound semiconductor substrate such as an indium phosphide (InP) substrate may be used. In this case, InP photodiodes may be fabricated in the substrates as built-in photo detectors. The ratio of the selected light component to the total sum of the four light components output from the wavelength filter 150 is not limited to one represented by photocurrents. A voltage ratio or a power ratio normalized by the total voltage or total power of the wavelength filter 150 may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the spirit and scope of the invention.

What is claimed is:

1. A wavelength tunable light source comprising:
   a light source,
   a wavelength monitor circuit configured to receive a portion of light emitted from the light source, and
   a processor that controls a wavelength of the light emitted from the light source based upon an output value of the wavelength monitor circuit,
   wherein the wavelength monitor circuit has a wavelength filter that outputs four light components with optical phases shifted by 90 degrees from one another, and multiple photo detectors configured to detect the four light components output from the wavelength filter, and
   wherein the processor selects at least one of the four light components, calculates a ratio of a monitor value of the at least one selected light component to a total sum of monitor values of the four light components, and adjusts the wavelength of the light source so as to bring the ratio to be closer to a target ratio at a designated wavelength.

2. The wavelength tunable light source as claimed in claim 1, wherein the processor selects the light component out of the four light components that maximizes a rate of change of output light of the wavelength filter when calculating the ratio.

3. The wavelength tunable light source as claimed in claim 2, further comprising:
   a memory that saves a change in the ratio of each of the selected light components to the total sum of the four light components in advance as spectrum information,
   wherein the processor selects a light component represented by a spectrum with a greatest rate of change at the designated wavelength.

4. The wavelength tunable light source as claimed in claim 1,
   wherein the processor receives photocurrent values of the four light components individually from the wavelength monitor circuit and calculates the ratio.

5. The wavelength tunable light source as claimed in claim 1,
   wherein the processor receives a first photocurrent value representing a first light component of the four light components, a second photocurrent value representing a second light component of the four light components, and a third photocurrent value representing a combination of third and fourth light components.

6. The wavelength tunable light source as claimed in claim 1,
   wherein the processor adjusts a gain of the light source using a monitor value of the selected light component.

7. A light source module comprising:
   a light source; and
   a wavelength monitoring circuit that monitors a portion of light emitted from the light source and outputs a monitoring result,
   wherein the wavelength monitoring circuit has a wavelength filter that outputs four light components with optical phases shifted by 90 degrees from one another, and three or more photo detectors that detect the four light components, detection results of all the four light components being used to monitor a wavelength of the light source.

8. The light source module as claimed in claim 7,
   wherein the wavelength filter has four output waveguides,
   wherein the wavelength monitoring circuit has four photo detectors connected to the four output waveguides, respectively, and
   wherein photocurrent values detected by the four photo detectors are output as the monitoring result from the wavelength monitoring circuit.

9. A light source module comprising:
   a light source; and
   a wavelength monitoring circuit that monitors a portion of light emitted from the light source and outputs a monitoring result,
   wherein the wavelength monitoring circuit has a wavelength filter that outputs four light components with optical phases shifted by 90 degrees from one another, and multiple photo detectors that detect the four light components and output a detection result as the monitoring result,
   wherein the wavelength filter has four output waveguides,
   wherein the wavelength monitoring circuit has four photo detectors connected to the four output waveguides, respectively, and
   wherein a first photocurrent value detected by a first photo detector among the four photo detectors is output as a first monitor value, a second photocurrent value detected by a second photo detector is output as a second monitor value, and a combination of photocurrents detected by third and fourth photo detectors are output as a third monitor value, from the wavelength monitoring circuit.

10. The light source module as claimed in claim 7,
    wherein the wavelength filter has four output waveguides, and
    wherein the wavelength monitoring circuit has a first photo detector connected to a first output waveguide among the four output waveguides, a second photo detector connected to a second output waveguide among the four output waveguides, and a third photo detector connected commonly to third and fourth output waveguides.

11. The light source module as claimed in claim 7,
    wherein the wavelength filter and the three or more photo detectors are formed monolithically in a first substrate, and
    wherein outputs of the three or more photo detectors are supplied externally as three monitor values from a second substrate.

12. The light source module as claimed in claim 7,
    wherein the wavelength filter has four output waveguides, and
    wherein a wavelength of the light source is controlled such that a ratio of a monitor value acquired from one of the four output waveguides to a total monitor value acquired from the four output waveguides approaches a target ratio.

13. A wavelength control method for controlling a wavelength of a light source, comprising:
    guiding a portion of light emitted from the light source to a wavelength filter that has a periodically changing transmission characteristic;
    detecting four light components output from the wavelength filter, the four light components having optical phases shifted by 90 degrees from one another;
    at a processor, acquiring a detection result of the four light components and calculating a ratio of a monitor value from at least one of the four light components to a total sum of monitor values of the four light components; and
    controlling the wavelength of the light source so as to bring the ratio to be closer to a target ratio at a designated wavelength.

14. The wavelength control method as claimed in claim 13, further comprising:
   at the processor, for the calculation of the ratio, selecting said one of the four light components that maximizes a rate of change of output light of the wavelength filter at the designated wavelength.

15. The wavelength control method as claimed in claim 14, wherein three or more monitor values representing the detection result of the four light components are input to the processor, and the ratio is calculated based upon the three or more monitor values.

* * * * *